United States Patent [19]

Torisaka et al.

[11] Patent Number: 4,600,446
[45] Date of Patent: Jul. 15, 1986

[54] METHOD FOR TEMPERING AND WORKING HIGH STRENGTH LOW DUCTILE ALLOY

[75] Inventors: Yasunori Torisaka; Kiyoyuki Ohuchi; Yoshinori Nakazawa, all of Ibaraki, Japan

[73] Assignees: Agency of Industrial Science & Technology; Ministry of International Trade & Industry, both of Tokyo, Japan

[21] Appl. No.: 657,248

[22] Filed: Oct. 3, 1984

[30] Foreign Application Priority Data

Oct. 8, 1983 [JP] Japan .................. 58-188908

[51] Int. Cl.$^4$ .................................................. C21D 9/52
[52] U.S. Cl. ............................................. 148/2; 148/11.5 Q
[58] Field of Search ............................. 148/2, 11.5 Q

[56] References Cited

U.S. PATENT DOCUMENTS 4,447,946  5/1984  Marancik ................ 148/11.5 Q

*Primary Examiner*—R. Dean
*Attorney, Agent, or Firm*—Schwartz & Weinrieb

[57] ABSTRACT

A high strength low ductile alloy is formed in a desired shape with high accuracy by bundling a multiplicity of fine wires made of the high strength low ductile alloy, consolidating the bundle of fine wires into a prescribed shape thereby giving rise to a formed product wherein the interiors of the fine wires comprises aggregates of very fine grains resulting from primary recrystallization and subjecting the formed product to thermal treatment for grain growth at the temperature of secondary recrystallization whereby the very fine grains undergo grain growth.

23 Claims, 11 Drawing Figures

METHOD FOR TEMPERING AND WORKING HIGH STRENGTH LOW DUCTILE ALLOY

BACKGROUND OF THE INVENTION

1. Field of the Invention

This invention relates to a method for tempering and working a high strength low ductile alloy.

2. Description of Prior Art

In the production of a gas turbine engine, for example, the turbine blades and disks which are by nature exposed to harsh conditions of high temperature, high pressure and oxidative atmosphere are required to be made of an alloy possessing high temperature strength and an oxidative corrosion resistance both surpassing design levels. Numerous nickel-base alloys have been developed and put to use in such applications. Although these alloys satisfy the standards of high temperature strength and oxidative corrosion resistance of demanded, they have been inevitably developed at some expense of workability because the strength of an alloy as this kind increases in proportion as the ease of working is decreased. In the production of a jet engine which consists of thousands of parts formed in complicated shapes at close tolerances, the workability of the alloy used constitutes a principal factor for determining the degree of usefulness of the alloys. In many branches of industry, the solution to the problem of this workability of the alloy can be attempted by conveniently altering alloy compositions. For the alloy used in the production of a gas turbine engine, the improvement in the method of working itself is an indispensable requirement without reference to the necessity for the alteration of the alloy composition, because the alloy is subject to a host of related standards.

OBJECTS OF THE INVENTION

A primary object of this invention is to provide a tempering and working method capable of forging a high strength low ductile alloy into products exhibiting a high grain aspect ratio and possessing a controlled strength property distribution.

Another object of this invention is to provide a tempering and working method which enables a high strength low ductile alloy to be worked into products of various complicated shapes easily in conformity with close tolerance standards without relying on cutting operations.

SUMMARY OF THE INVENTION

To accomplish the objects described above, the tempering and working method of this invention comprises bundling and consolidating a multiplicity of fine wires made of high strength low ductile alloy, forming the consolidated bundle of fine wires in a required shape thereby giving rise to a formed product wherein the interiors of the fine wires are in a state of very fine grains resulting from primary recrystallization and the surface or inner parts of the fine wires form an obstacle region to grain growth oriented in the direction of length of the fine wires, and annealing the shaped product for grain growth at the temperature of secondary recrystallization thereby enabling the aforementioned very fine grains to undergo grain growth along the obstacle region. A modified aspect of this invention comprises subjecting the aforementioned bundle of fine wires, prior to the consolidation, to annealing for grain growth at the temperature of secondary recrystallization thereby allowing the aforementioned very fine grains to grow along the obstacle region to grain growth, and thereafter consolidating the bundle of fine wires.

In accordance with this invention, therefore, desired enhancement of the grain aspect ratio is attained by utilizing either the MC carbide precipitated during the forming of high strength low ductile alloy or the nonmetallic inclusion added in a very minute amount in forming an obstacle region to grain growth in the direction of length of the very fine wires and enabling the grains of the fine wires to grow along the obstacle region. Thus, the consolidated bundle of fine wires is formed in advance in the shape of the final product and the shaped product is enabled to have its grains grown in the direction in which the final product is required to manifest strength during service. Otherwise, the fine wires which have the grains thereof grown in advance along the length thereof are consolidated and formed in a given shape to give rise to a shaped product enjoying notably enhanced creep strength at high temperatures. By the method described above, therefore, products of complicated shapes can be obtained with ease.

BRIEF DESCRIPTION OF THE DRAWINGS

The other objects and characteristic features of the present invention will become apparent to those skilled in the art as the further disclosure is made in the following description of a preferred emobodiment of the invention, as illustrated in the accompanying drawings, wherein.

DESCRIPTION OF PREFERRED EMBODIMENT

As high temperature low ductile alloys to be formed by the present invention, all heat resisting Ni, Mo, Fe base alloys whose recrystallization temperatures exceed their consolidation temperatures may be cited. Such a low ductile alloy is first fabricated into fine wires by the melt method or the plastic working method.

The aforementioned fine wires are produced to a diameter of not more than approximately 100 microns, preferably on the order of several microns. These fine wires may be produced of substantially the same diameter and bundled or they may be produced of several different diameters and similarly bundled. Otherwise, fine wires may be produced of different materials of the same or different diameters and bundled.

Generally, the aspect ratio acquired by the product increases in proportion as the diameter of the fine wires decreases.

When the fine wires described above are fabricated by the melt method, the apparatus constructed as illustrated in FIGS. 1-4 are properly selected and used.

Figure 1:
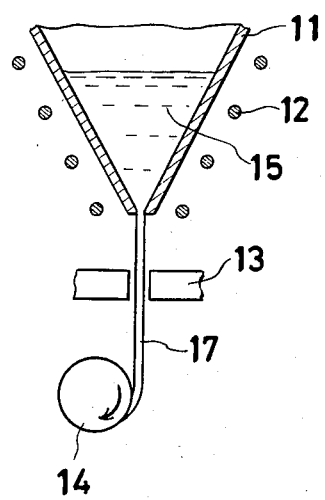
FIG. 1 is an explanatory diagram illustrating the fabrication of a fine wire, the starting material, by the melt method as a first embodiment.

Referring to FIG. 1, 11 stands for a container, 12 for a high-frequency induction heating coil, 13 for a cooling device, and 14 for a winder. Melted metal 15 reduced to a melted state by the aforementioned heating coil 12 is drawn out in the form of a thread, then taken up as cooled by the cooling device 13 using cold water or dry ice as coolant. The aforementioned melted metal 15 may be forced out in the form of a thread 17 by the force of the blasting of an explosive above the surface of the melted metal and the thread of melted metal discharged from the container 11 is pulled out as nipped between a pair of rollers (not shown), cooled and formed as desired.

Figure 2:
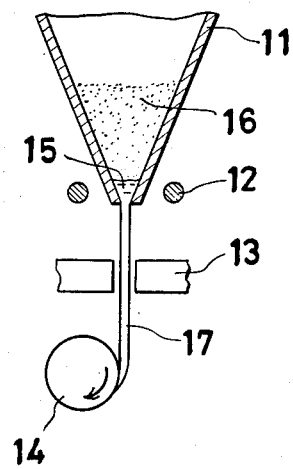
FIG. 2 is an explanatory diagram illustrating the fabrication by the melt method as a second embodiment.
Figure 3:
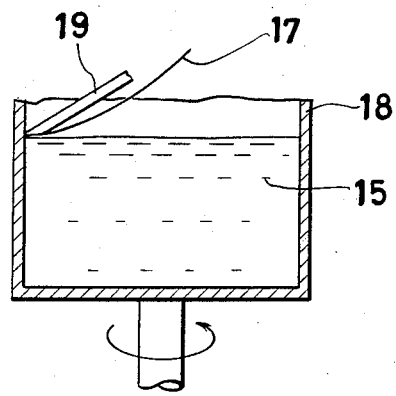
FIG. 3 is an explanatory diagram illustrating the fabrication by the melt method as a third embodiment.
Figure 4:
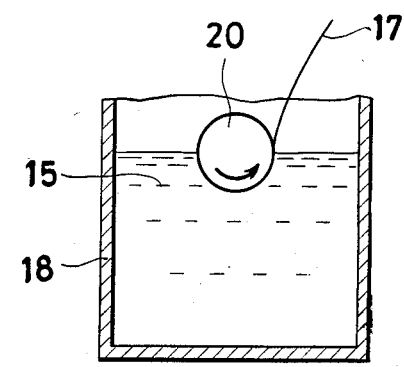
FIG. 4 is an explanatory diagram illustrating the fabrication by the melt method as a fourth embodiment.

FIG. 2 represents an embodiment wherein powder material 16 such as an alloy powder or element powder is placed in the container 11 and only the part of the powder material held in the bottom part of the container is heated with the heating coil 12 disposed near the outlet of the container 11 and the melted metal 15 consequently produced is drawn out. FIG. 3 depicts an embodiment wherein the melted metal 15 placed in a container 18 is drawn out in the form of a fine metal wire 17 by keeping the container 18 in rotation and holding a scraping bar 19 against the melted metal along the inner periphery of the container 18. FIG. 4 shows an embodiment wherein the surface portion of the melted metal 15 placed in a container 18 is drawn out in the form of fine metal wire 17 by rotating a turntable 20 partly immersed under the surface of the melted metal 15.

With any of the apparatus described above, a given low ductile alloy can be fabricated into a fine wire of a diameter in the range of several microns to 100 microns by controlling the magnitude of the pressure exerted on the melted metal and the speed at which the melted metal discharged from the container is drawn out.

The fine wire obtained as described above is desired to possess an amorphous texture or a structure resembling one and, therefore, is desired to be subjected further to a drawing process. This is because this process renders the fine wire easy to cause solid diffusion during the subsequent step of solidification and acquire superplasticity. The fabrication of fine wires by the aforementioned melt method and the drawing may be performed either on one fine wire at a time or on a bundle of a plurality of fine wires at the same time.

For the fabrication of a fine wire by the plastic working method, the following procedures may be suitably selected and used.

(1) Procedure of swaging the fine wire in a melted state and subsequently drawing it.

Figure 5:
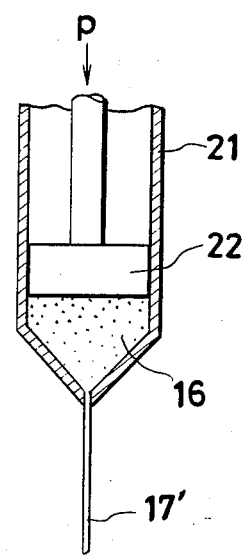
FIG. 5 is an explanatory diagram illustrating the fabrication of a fine wire, the starting materials, by the plastic working method.

(2) Procedure of extruding the powder such as an alloy powder or element powder as the raw material from a container 21 constructed as illustrated in FIG. 5 with the high pressure of a ram 22 operated under a load P to produce a fine metal wire 17' and optionally subjecting the fine metal wire to a drawing process.

(3) Procedure of pressing the aforementioned powder, sintering the pressed mass of powder, swaging the sintered mass, and subjecting it to the drawing process.

(4) Procedure of hot pressing the aforementioned powder, then swaging the pressed mass of powder, and subjecting the swaged mass to the drawing process.

(5) Procedure of cold isostatic pressing the aforementioned powder, swaging the pressed mass of powder, and subjecting the swaged mass to the drawing process.

(6) Procedure of cold isostatic pressing the aforementioned powder, then hot pressing the pressed mass of powder under static water pressure, swaging the pressed mass, and drawing it.

(7) Procedure of hot isostatic pressing the aforementioned powder, swaging the pressed mass of powder, and drawing it.

In any of the procedures (1) and (3) through (7) described above, the step of extrusion may be incorporated before the step of swaging. The aforementioned operations of swaging and drawing are desired to be carried out just below the temperature of recrystallization. The final stage of the drawing is desired to be carried out at a temperature between the temperature of recrystallization and 300° C. below that temperature. This is because controlling the treatment in this way makes the solid diffusion and plastic working easy, as in the aforementioned melt method.

In accordance with the plastic working method which is performed as described above, the fine wire consequently fabricated is given the strain necessary for formation of very fine grains by being heated to the temperature of primary recrystallization. If the strain is insufficient for primary recrystallization, then the fine wire must be subjected to the treatment of drawing aimed at conferring appropriate strain.

When fine wires are produced from a heat resisting Ni, Fe, or Mo base alloy by the melt method, bundled and consolidated, the MC carbide existing as a supersaturated solid solution in the matrix is precipitated along the fine wire surface. Thus, the MC carbide is oriented in the direction of length. In consequence of the primary recrystallization, the fine wires will come to possess very fine grains in their interiors. As a result, these fine wires become easy to deform and can be formed using only a small force in spite of the fact that they are made from high-strength, low ductile material. The fine wire fabricated by the plastic working method cannot be expected to form any MC carbide. It, therefore, requires addition to its surface of a minute amount of a non-metallic inclusion such as, for example, $Al_2O_3$, $ThO_2$, or $Y_2O_3$ which impedes the growth of grains. The subsequent treatments and alteration of texture which the fine wires will undergo are the same as those involved in the case of the aforementioned melt method.

The MC carbide or the non-metallic inclusion, in the annealing for grain growth which will be described more fully afterward, functions as an obstacle region to grain growth.

For the aforementioned consolidation, the bundled fine wires are hot isostatic pressed or cold pressed under static water pressure and sintered or otherwise treated at a temperature approximating the temperature of primary recrystallization.

By the aforementioned consolidation, primary grains are produced within the individual fine wires, with the result that such primary grains will be further refined into very fine grains of an extremely small particle size, making the fine wires easy to form, and, at the same time, solid diffusion along the fine grain boundaries will be facilitated to a great extent. Thus, the fine wires are enabled to acquire true density by the consolidation which is performed at low temperature under low pressure for a short time.

Figure 6A:
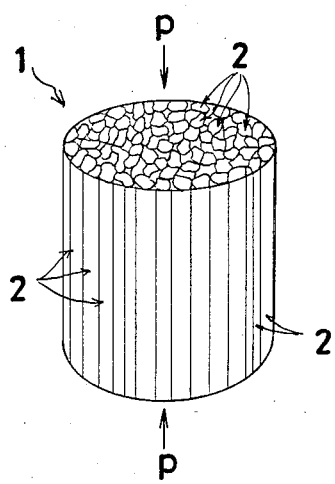
FIG. 6(a) is a perspective view of a bundle of fine wires fabricated in a consolidated state according to the present invention.

FIG. 6(a) is a perspective view illustrating, in the form of a model, the bundle of fine wires in a consolidated state. FIGS. 6(b), (c) represent magnified cross sections of the bundle of fine wires taken perpendicularly and parallel to the length of the bundled fine wires.

Figure 6C:
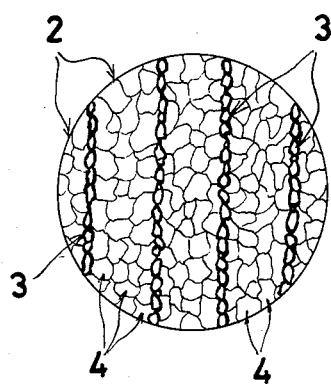
FIG. 6(c) is a magnified longitudinal cross sectional view of the bundle of fine wires of FIG. 6(a).
Figure 6B:
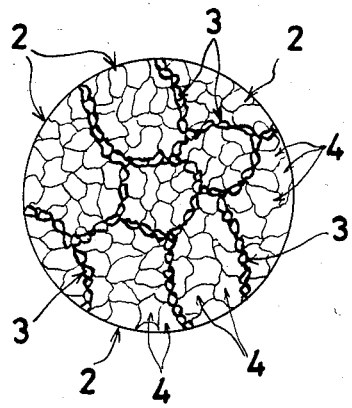
FIG. 6(b) is a magnified cross sectional view of the bundle of fine wires of FIG. 6(a).

As shown in FIGS. 6(a)–(c), in a block 1 of bundled fine wires in a consolidated state, the interiors of the individual fine wires 2 are formed of very fine grains 4 which are held as enclosed with the MC carbide (wherein M stands for a metal) or the non-metallic inclusions 3. During the consolidation of this block 1, the temperature at which the bundle of fine wires is heated for substantial reduction of grain size is selected so as to suit the drawing reduction in area performed on the fine wires for imparting strain, the duration of heating, and the like. Generally, however, this temperature is limited to the range of the temperature of primary recrystallization ± about 300° C.

Subsequently, the block 1 of fine wires 2 now in the state illustrated in FIG. 6(a) and capable of being formed with extremely small force is placed in a die (not shown) having a cavity of the desired shape and heated in advance to the superplastic temperature, that is, a temperature about 200° C. lower than the temperature of primary recrystallization and forged therein under a compressive load P, to give rise to a forged product 5 of a desired shape.

In the forged product 5 mentioned above, the individual fine wires 2 are laid, as plastically deformed, after the pattern of bundled fibers along the contour of the forged product 5. During the forging, due attention should be paid to enabling the individual fine wires 2 to be oriented in the direction in which the final product is required to manifest strength.

Even after the bundle of fine wires has undergone the aforementioned consolidation, the very fine grains within the individual fine wires 2 still remain in the state of primary recrystallization illustrated in FIGS. 6(a)–(c).

In the procedure described above, the operation of forging at the aforementioned superplastic temperature is no longer necessary when the consolidation of the multiplicity of fine wires is capable of giving the bundled fine wires the shape of final product or a shape resembling such shape.

Then, in order that the shaped product obtained as described above may acquire high strength, it is thermally treated at a temperature higher than the temperature of primary recrystallization and the aforementioned very fine grains are consequently enabled to undergo secondary recrystallization and grow notably in size.

Figure 8:
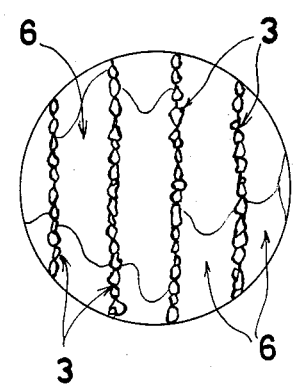
FIG. 8 is a magnified cross sectional view of a forged bundle of fine wires in the state assumed after thermal treatment.
Figure 7:
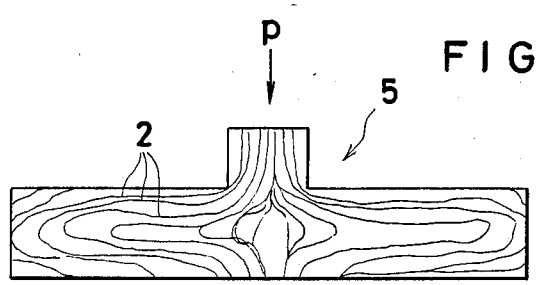
FIG. 7 is an explanatory diagram illustrating a bundle of fine wires in a forged state.

To be more specific, when the forged product 5 of FIG. 7 is heated to the temperature of secondary recrystallization which is higher than the temperature of primary recrystallization for the growth of grains, the very fine grains of FIGS. 6(a)–(c) grow along the direction in which the MC carbide runs within the region surrounded by that carbide 3, to give rise to coarse grains 6 having a high grain aspect ratio as shown in FIG. 8. In the case of a Ni-base heat resisting alloy IN-100 which will be more fully described afterward, for example, this thermal treatment is carried out at a temperature in the range of 1150° to 1250° C. for not less than 1 hour and up to 15 hours. The aspect ratio of the produced grains increases in proportion as the cross-sectional area of the obstacle region to grain growth surrounded by the MC carbide decreases and the length of the grown grains increases. This grain aspect ratio can be controlled roughly in the range of 1:2–100.

The present invention, as described above, obtains its product of a high grain aspect ratio by first consolidating a bundle of fine wires made of high strength low ductile alloy and vested with necessary strain, then forging the consolidated bundle of fine wires into a prescribed shape, and finally subjecting the forged mass to a treatment for grain growth. Optionally, this product may be obtained by first subjecting the fine wires to a thermal treatment thereby allowing the grains of the fine wires to grow in the direction of length of the fine wires and adjusting the grain aspect ratio of such grains to a prescribed value, subsequently bundling the fine wires and consolidating the bundled fine wires, and optionally forging the consolidated bundle of fine wires into a prescribed shape. The consolidation may be carried out at any temperature which is below the temperature of secondary recrystallization and which permits acquisition of full density ratio.

Figure 9:
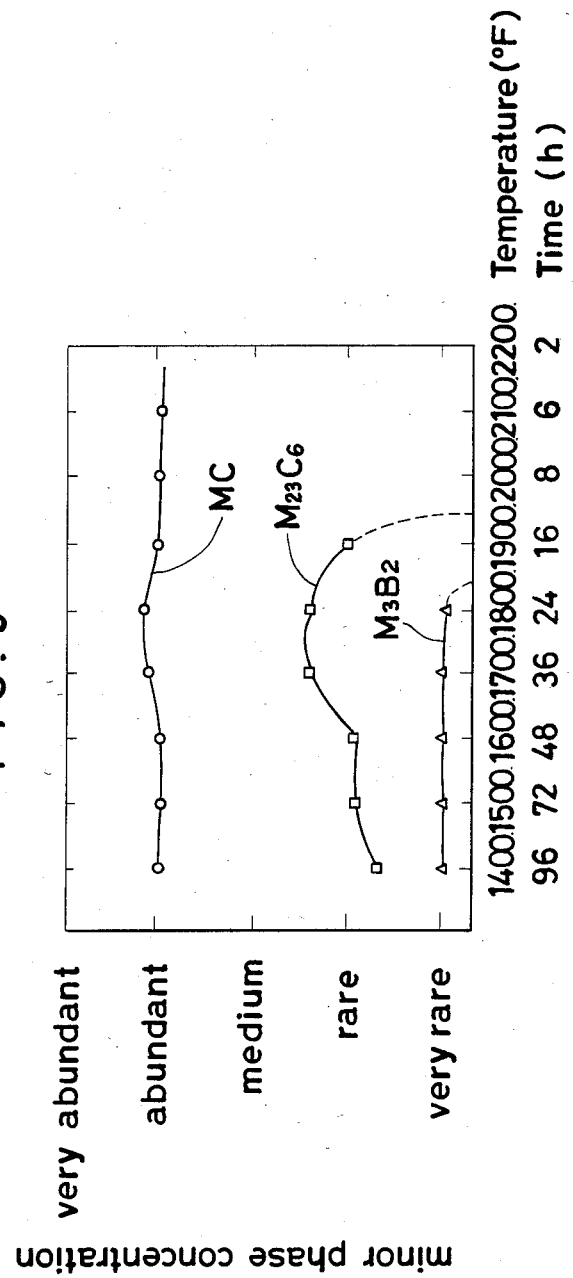
FIG. 9 is a graph showing the behavior of the carbide at high temperatures.

Generally, the high strength low ductile alloy is used in the form of atomized powder for protection of the second phase against coarsening and segregation. During the solidification of this powder, the MC type carbide is precipitated in the grain boundaries of the powder. As is noted from the graph in FIG. 9 (H. E. Collins: Transactions of the ASM, 62 (1969), 82.) which represents the behavior of the carbide of a typical nickel base superalloy (produced by the International Nickel Company of the United States and marketed under the tradename IN-100) at high temperatures, the aforementioned precipitate not only persists when the alloy is heated but also constitutes a major cause for degradation of the creep strength at high temperatures. This invention contemplates advantageously utilizing the MC carbide precipitated on the surface of fine wires or along the grain boundaries or the dispersed non-metallic inclusion in obtaining a forged product possessing high strength in a desired direction. Specifically, by causing the surface of fine wires, the MC carbide, or the non-metallic inclusion to be oriented in the direction in which the product is required to manifest its strength, the effect of the MC carbide, and the like, in the direction in which the load is applied to bear on the product during its use can be completely eliminated.

The MC carbide, the non-metallic inclusion, and the like, impede the growth of grains. Generally, they constitute one factor detrimental to the thermal treatment for grain growth. When the MC carbide remains as precipitated to cover the fine wires as shown in FIGS. 6(a)–(c), it increases the grain aspect ratio of the grains, namely it enables the grains to grow as shown in FIG. 8 in the direction in which the product is required to manifest its strength while in use, and notably improves the creep strength at high temperatures during the course of the thermal treatment for grain growth.

When the nickel base superalloy produced by the International Nickel Company of the United States and marketed under the tradename IN-100 is used as a typical high strength low ductile alloy, a multiplicity of fine wires made of the superalloy are bundled and the bundled fine wires are compression formed in a desired shape under static pressure in the neighborhood of the temperature, 1150° C., for primary recrystallization for one hour. Consequently, the MC carbide is precipitated on the initial outer surfaces of the fine wires as shown in FIG. 6(a) and very fine grains 4 are formed inside the fine wires 2 as shown in FIGS. 6(b), (c). Then, the block 1 shown in FIG. 6(a) is forged with compressive load within a heating die at the superplastic temperature, that is 950° to 1150° C. and, as a result, the initial fine wires 2 are reduced to a state oriented in the direction in which they are required to manifest strength. The block 1 thus forged is now subjected to a thermal treatment at 1150° to 1250° C. for not less than 1 hour and up to 15 hours and, as a result, the very fine grains within the fine wires coalesce into coarse grains as shown in FIG. 8. The extent of the growth of such grains can be controlled by regulating the temperature of heating and the duration of thermal treatment. Thus, there can be obtained a product having a desired aspect ratio.

As described in detail above, the forging method of this invention enables a given high strength low ductile alloy to be easily formed in a desired shape with high accuracy and confers notably high strength upon the forged product.

Obviously, many modifications and variations of the present invention are possible in light of the above teachings. It is therefore to be understood that within the scope of the appended claims, the present invention may be practiced otherwise than as specifically described herein.

What is claimed is:

1. A method for tempering and working a high-strength, low ductile alloy, comprising the steps of:
providing a plurality of fine wires, fabricated from said high-strength, low ductile alloy, such that the surface of each of said plurality of fine wires defines an obstacle region, to grain growth, oriented in the direction of the length of each of said fine wires;
bundling said multiplicity of fine wires together;
consolidating and forming said bundle of fine wires into a prescribed shape so as to fabricate a formed product;
subjecting said formed product to thermal treatment at the temperature of primary recrystallization whereby the interior regions of said fine wires form aggregates of very fine grains; and
subsequently subjecting said formed product to thermal treatment at the temperature of secondary recrystallization whereby said very fine grains are enabled to grow along said obstacle regions.

2. A method according to claim 1, wherein said high strength low ductile alloy is a Ni, Mo, or Fe base alloy.

3. A method according to claim 1, wherein said fine wires possess a diameter in the range of several microns to 100 microns.

4. A method according to claim 3, said fine wires are fabricated by the melt method.

5. A method according to claim 3, wherein said fine wires are fabricated by the plastic working method.

6. A method as set forth in claim 4, wherein:
said obstacle regions of said fine wires are defined by the MC carbide existing as a supersaturated solid solution within said low ductile alloy matrix and precipitated along said surfaces of said fine wires.

7. A method as set forth in claim 5, wherein:
said obstacle regions of said fine wires are defined by a non-metallic inclusion deposited upon said surfaces of said fine wires.

8. A method as set forth in claim 1, wherein:
said temperature of primary recrystallization is approximately 1150° C.

9. A method as set forth in claim 1, wherein:
said thermal treatment of said formed product at said temperature of primary recrystallization is maintained for approximately one hour.

10. A method as set forth in claim 1, wherein:
said temperature of secondary recrystallization is within the range of 1150° C.-1250° C.

11. A method as set forth in claim 1, wherein:
said thermal treatment of said formed product as said temperature of secondary recrystallization is maintained for a period of time within the range of 1-15 hours.

12. A method for tempering and working a high-strength low ductile alloy, comprising the steps of:
providing a plurality of fine wires, fabricated from said high-strength, low ductile alloy, such that the surface of each of said plurality of fine wires defines an obstacle region, to grain growth, oriented in the direction of the length of each of said fine wires;
subjecting said fine wires to a continuous thermal treatment up to and including the temperature of secondary recrystallization whereby aggregates of very fine grains, formed within the interior regions of said fine wires at the temperature of primary recrystallization, are enabled to grow along said obstacle regions;
bundling said plurality of fine wires together; and
consolidating and forming said bundle of fine wires into a prescribed shape so as to fabricate of formed product.

13. A method according to claim 12, wherein said high strength low ductile alloy is a Ni, Mo, or Fe base alloy.

14. A method according to claim 12, wherein said fine wires possess a diameter in the range of several microns to 100 microns.

15. A method according to claim 14, said fine wires are fabricated by the melt method.

16. A method according to claim 14, wherein said fine wires are fabricated by the plastic working method.

17. A method as set forth in claim 15, wherein:
said obstacle regions of said fine wires are defined by the MC carbide existing as a supersaturated solid solution within said low ductile alloy matrix and precipitated along said surfaces of said fine wires.

18. A method as set forth in claim 16, wherein:
said obstacle regions of said fine wires are defined by a non-metallic inclusion deposited upon said surfaces of said fine wires.

19. A method as set forth in claim 12, wherein:
said temperature of primary recrystallization is approximately 1150° C.

20. A method as set forth in claim 12, wherein:
said thermal treatment of said fine wires at said temperature of primary recrystallization is maintained for approximately one hour.

21. A method as set forth in claim 12, wherein:
said temperature of secondary recrystallization is within the range of 1150° C.-1250° C.

22. A method as set forth in claim 12, wherein:

said thermal treatment of said fine wires at said temperature of secondary recrystallization is maintained for a period of time within the range of 1–15 hours.

23. A method for tempering and working a high-strength, low ductile alloy, comprising the steps of:
providing a plurality of fine wires, fabricated from said high-strength, low-ductile alloy, such that the surface of each of said plurality of fine wires defines an obstacle region, to grain growth, oriented in the direction of the length of each of said fine wires;

subjecting each of said plurality of fine wires to thermal treatment at the temperature of primary recrystallization whereby the interior region of each of said fine wires forms an aggregate of very fine grains; and subsequently subjecting each of said plurality of fine wires to thermal treatment at the temperature of secondary recrystallization whereby said very fine grains of said wires are enabled to grow along said obstacle regions.

* * * * *